Figure 1:
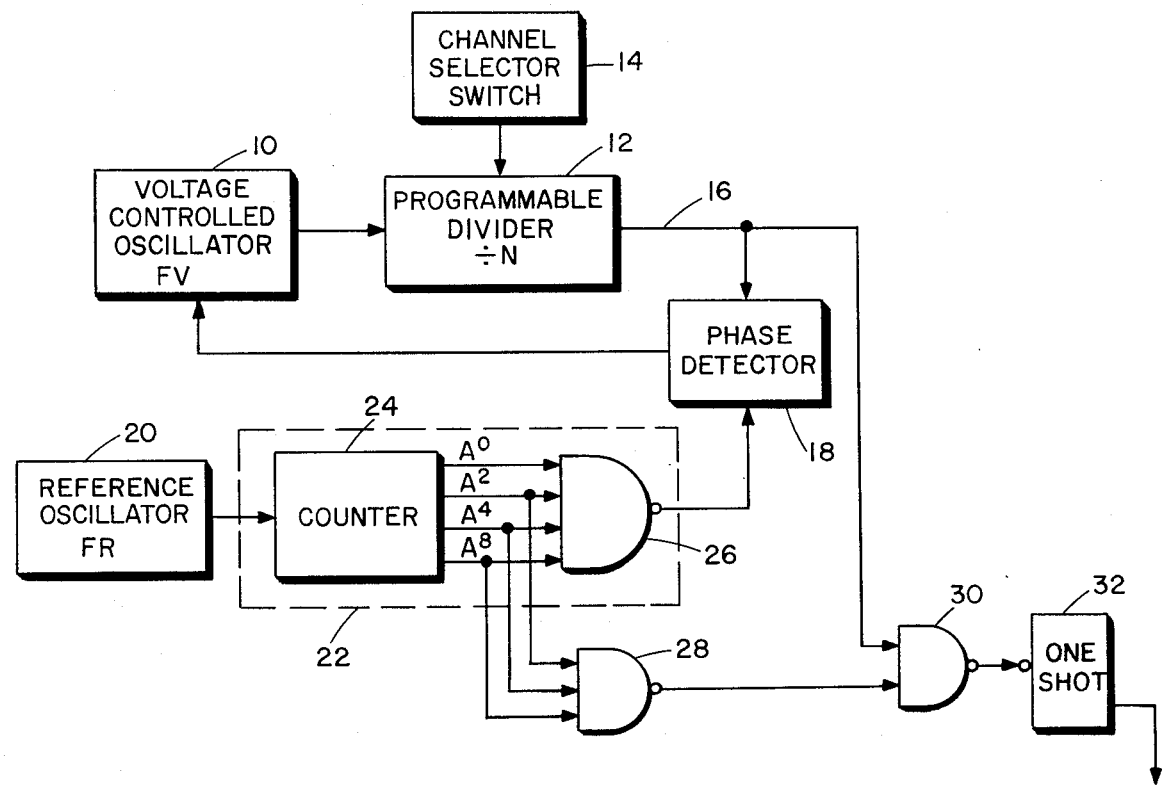

United States Patent [19]
Sharpe

[11] 3,988,696
[45] Oct. 26, 1976

[54] PHASE LOCK DETECTOR FOR DIGITAL FREQUENCY SYNTHESIZER

[75] Inventor: Claude A. Sharpe, Fort Lauderdale, Fla.

[73] Assignee: The Bendix Corporation, Southfield, Mich.

[22] Filed: Nov. 28, 1975

[21] Appl. No.: 636,349

[52] U.S. Cl. ............................ 331/1 A; 328/133; 328/155; 331/25; 331/64
[51] Int. Cl.² ........................................ H03B 3/04
[58] Field of Search ............... 331/1 A, 18, 25, 64; 332/19; 329/122; 328/133, 155

[56] References Cited
UNITED STATES PATENTS

| | | | |
|---|---|---|---|
| 3,659,224 | 4/1972 | Ball | 331/8 X |
| 3,893,042 | 7/1975 | Whitman et al. | 331/55 |
| 3,956,710 | 5/1976 | Seitz et al. | 331/1 A |

*Primary Examiner*—Siegfried H. Grimm
*Attorney, Agent, or Firm*—Bruce L. Lamb; W. G. Christoforo

[57] ABSTRACT

A phase lock detector for a digital frequency synthesizer. The frequency synthesizer includes a programmable digital frequency divider for the output signal, a reference frequency Fr oscillator and a phase lock loop which controls the frequency of the synthesizer output by comparing the phase of the frequency divider signal with the phase of the reference signal. The frequency Fr of the synthesizer is determined by programming N in the relationship $$Fv = \frac{N}{M} Fr.$$

The phase lock detector includes logic means providing a "window" which is "open" for a count which is symmetrically less than and more than the factor M. The detector does not signal "out-of-lock" condition as long as output from the programmable divider occurs during the time the detector window is open.

1 Claim, 2 Drawing Figures

PHASE LOCK DETECTOR FOR DIGITAL FREQUENCY SYNTHESIZER

The present invention relates to digital frequency synthesizers. More particularly, it relates to a phase lock detector for determining when the phase of the signal from the variable frequency oscillator of such a synthesizer has departed from the phase of the reference frequency oscillator thereof by an intolerable amount.

A particular application of the present invention is found in an airborne DME (Distance Measuring Equipment). In this equipment the distance of an aircraft from a ground station is determined by measuring the time elapsing from transmission of an interrogation signal from the aircraft to the receipt of a reply signal from a ground station. A memory device is instrumental in the computation of this time. To provide selectivity amongst the various ground stations which may be within range of an aircraft, ground stations are assigned different operating frequencies and the airborne equipment must be capable of tuning to these various channels. Digital frequency synthesizers, known in the art, presently provide the most satisfactory tuning means in this kind of equipment since they are readily adapted to remote control and provide highly stable and selective operation.

A digital frequency synthesizer usually comprises a voltage controlled oscillator (VCO), a reference oscillator and a phase detector for comparing the phase of a selected harmonic or sub-harmonic of the signal from the VCO with the fundamental or a harmonic or sub-harmonic of signal from the reference oscillator. The phase detector output, after being filtered, serves to control the frequency of the VCO and thus a panoply of highly stable signal frequencies becomes available, any one of which may be used by selecting a particular harmonic or sub-harmonic of the VCO frequency to be applied to phase detector.

It is desirable in many applications of such synthesizers to provide means for indicating when the VCO output is properly phase locked to the reference oscillator output or, to the same end, to indicate when the outputs are not properly locked. Indicators heretofore known suffer the disadvantage of having a too narrow range of permissible phase difference between the VCO and reference oscillator signals within which a "locked" condition is indicated and when attempts are made to broaden the range of tolerable phase error, such indicators become unreliable in operation.

It is therefore an object of the present invention to provide a phase lock indicator for a digital frequency synthesizer having a broader range of tolerable phase deviation while still reliably indicating a locked condition.

It is another object of the invention to provide such an indicator comprised of standard logic circuits without requiring threshold detectors, reference voltage comparators or similar complications in construction.

Briefly, in a digital frequency synthesizer wherein the output of a variable frequency oscillator divided in frequency by N is compared in phase with the output of a reference oscillator divided in frequency by M, the invention comprises the addition of logic means thereto which creates a window enabled or opened whenever the M dividing means reaches some integer state, i.e. state M−1 or state M−2 and continuing open through state M or M+1. If the output of the N divider, which is in pulse form, occurs during the time such window is open, an indicator multivibrator remains in a reset condition, signifying that a phase lock condition exists. If the N divider pulse occurs outside the window, the indicator multivibrator is triggered to a set condition, denoting that the synthesizer has lost phase lock.

Figure 2:
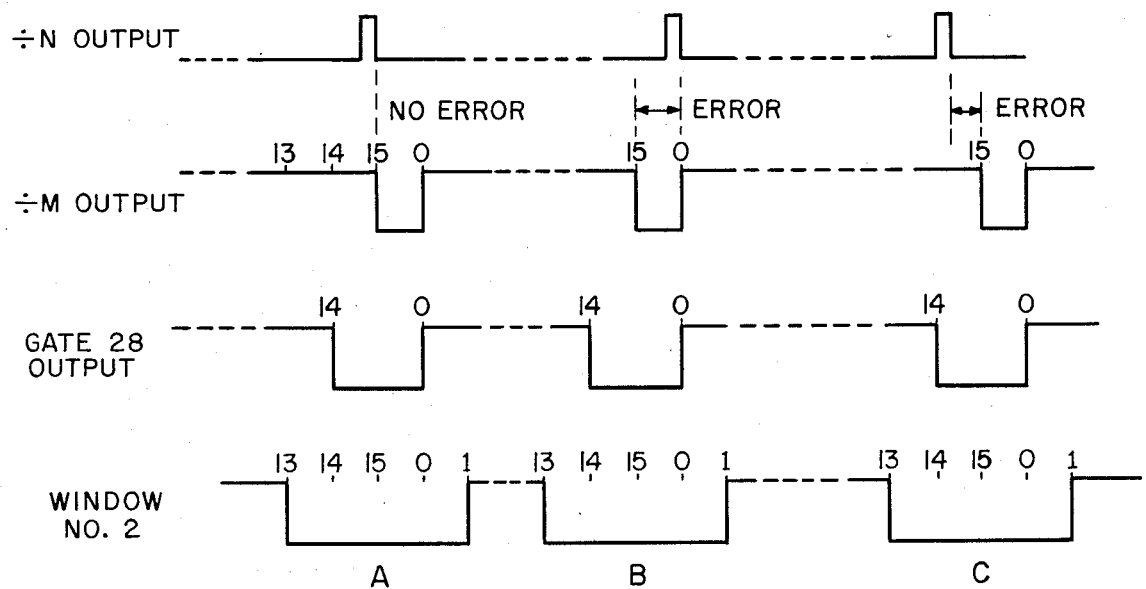

In the drawings:

FIG. 1 is a functional block diagram of a digital frequency synthesizer including the phase lock detector of the invention; and FIG. 2 is a group of waveform diagrams helpful in explaining the operation of the invention.

Referring to FIG. 1, a digital frequency synthesizer conventionally comprises a voltage controlled oscillator 10 supplying signal at frequency Fv to a programmable divider 12. Divider 12 divides the frequency of the signal input thereto by an integer N, the value of which is determined by a channel selector switch 14. Signal at the output 16 of divider 12, having a frequency of Fv/N, is applied as one input to a phase detector 18.

A highly stable reference oscillator 20 provides signal of frequency Fr to a divider 22 which divides the frequency of signal from oscillator 20 by a fixed integer M, thereby providing signal having a frequency Fr/M as a second input to phase detector 18. Divider 22 suitably comprises a binary counter 24 feeding a NAND gate 26 which is enabled upon the counter being driven to a state corresponding to the binary equivalent of M−1.

Phase detector 18 provides a suitably filtered output voltage for controlling the frequency of oscillator 10. This control voltage is related to the phase difference between the input signals to the pahse detector and is of such sense as to vary the frequency of oscillator 10, either increasing or decreasing the same, until the input signals to the phase detectors are locked in synchronism. When the phase detector input signals are synchronized, the following relationship applies:

$$\frac{Fv}{N} = \frac{Fr}{M} \text{ or } Fv = \frac{N}{M}Fr.$$

The utility of such a synthesizer in providing a wide tuning range of precise, stable channel frequencies is best demonstrated by example. It is desired to produce a transmitter having a frequency output of 1041–1150 MHz tunable in 1 MHz channels for use in DME. Through the use of a X4 frequency multiplier, the frequencies required of the VCO are reduced to 260.25–287.5 MHz, variable in increments of 0.25 MHz. A reference frequency of 1 MHz and a value of M = 16 were selected. Thus by varying the value of N from 4164 to 4600 in increments of 4, the VCO can be tuned in 0.25 MHz steps through the required frequency band.

The synthesizer as thus far described is known. The improvement of the present invention resides in the phase lock detector comprising NAND gates 28 and 30 and one-shot multivibrator 32.

In the preceding example of a digital frequency synthesizer a value of M = 16 was stated. In such case counter 24 provides a four digit binary output $A^0 A^2 A^4 A^8$. NAND gate 26 receives each of these digits and is enabled when the counter reaches a state 1111, the binary equivalent of 15. Remembering that the first cycle of a sequence from oscillator 20 sets counter 24 to 0000, state 1111 will be reached once for each 16 cycles of input signal. NAND gate 28 receives as inputs counter digits $A^2$ $A^4$ $A^8$ and hence is enabled during counter states 0111 and 1111 to produce O or LO input to NAND gate 30. If output on line 16 is 1 or HI during the time output from NAND gate 28 is LO, output of NAND gate 30 remains HI. If output on line 16 becomes HI during the time output from NAND gate 28 is HI, the output of gate 30 becomes LO, triggering one-shot 32 which then produces a signal for resetting a memory device (not shown) or for indicating for other purposes that the synthesizer is not in phase locked condition.

The operation of the invention may be better understood by reference to the waveform diagrams of FIG. 2. At A in FIG. 2 the synthesizer is properly phase locked with the trailing edge of the positive pulse output from divider 12 in time coincidence with the leading edge of the negative pulse from gate 26. When the synthesizer is subject to vibration, as frequently occurs in aircraft, power supply variation or other disturbance, phase errors as indicated at B and C in FIG. 2 likely to be introduced. These phase errors are of temporary duration and are not of sufficient magnitude to adversely affect operation of the equipment. However, they are of sufficient magnitude to trigger an out-of-lock indicator if the same operates by detection of lack of coincidence of the pulse edges.

Gate 28, by decoding symmetrically about the state of counter 24 where phase lock occurs, creates a window of tolerable phase error and does not allow an indication of loss of phase lock unless the phase error exceeds this tolerance. As long as the pulse from divider 12 appears when the output of gate 28 is low, gate 30 will not cause one-shot 32 to be triggered. The phase tolerance created by the window of gate 28 is $2/16 \times 2\pi = \pi/4$ radians. Since the pulse from divider 12 is very narrow (100 ns.) this provides a tolerance of $+\pi/8$ to $-\pi/8$ permissible phase deviation before loss of phase lock is indicated. As shown in the lowermost waveform of FIG. 2, labeled "Window No. 2", gate 28 could be modified to decode 4 counts symmetrically about the lock-up point, in which case the phase tolerance is increased to $4/16 \times 2\pi$, or $+\pi/4$ to $-\pi/4$. If desired, even wider tolerance can be provided by further increase in the decoding capacity of gate 28.

Obviously, the specification herein of particular values for frequencies, divisors, logic connections and the like are merely exemplary and the invention may be practiced otherwise than as specifically disclosed without departing from the spirit and scope of the appended claims.

The invention claimed is:

1. In a digital frequency synthesizer including a voltage controlled oscillator, first frequency dividing means for dividing the frequency of signal from said voltage controlled oscillator by a factor N; a reference oscillator, second frequency dividing means for dividing the frequency of signal from said reference oscillator by a factor M; and means for comparing the phase of outputs from said first and second frequency dividing means and providing control voltage for said voltage cpntrolled oscillator related to the phase difference between said dividing means outputs, a phase lock detector, comprising:

first logic means providing an output which changes state periodically for an interval which begins after the appearance of M-K cycles of signal from said reference oscillator, K being a predetermined integer, and continues at least until the appearance of M cycles of signal from said reference oscillator;

second logic means for determining the time coincidence of signal from said first frequency dividing means with said change of state interval of said first logic means; and means controlled by second logic means for producing an out-of-lock signal whenever signal from said first frequency dividing means fails to appear during said interval of said first logic means.

* * * * *